US011761691B2

(12) United States Patent
Chang et al.

(10) Patent No.: US 11,761,691 B2
(45) Date of Patent: Sep. 19, 2023

(54) COOLING AND HEATING ENERGY SAVING SYSTEM AND ENERGY SAVING METHOD

(71) Applicant: Fulian Precision Electronics (Tianjin) Co., LTD., Tianjin (CN)

(72) Inventors: Chih-Hung Chang, New Taipei (TW); Chao-Ke Wei, New Taipei (TW); Tze-Chern Mao, New Taipei (TW); Yen-Chun Fu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 325 days.

(21) Appl. No.: 17/022,342

(22) Filed: Sep. 16, 2020

(65) Prior Publication Data
US 2021/0389029 A1      Dec. 16, 2021

(30) Foreign Application Priority Data

Jun. 10, 2020   (CN) .......................... 202010525079.5

(51) Int. Cl.
*F25B 29/00* (2006.01)
*H05K 7/20* (2006.01)

(52) U.S. Cl.
CPC ........... *F25B 29/00* (2013.01); *H05K 7/2079* (2013.01); *H05K 7/20272* (2013.01); *F24D 2200/29* (2013.01)

(58) Field of Classification Search
CPC .. F29B 29/00; H05K 7/20272; H05K 7/2079; F24D 2200/29

USPC .............................................. 165/210, 104.33
See application file for complete search history.

(56) References Cited

U.S. PATENT DOCUMENTS

| 8,146,374 | B1* | 4/2012 | Zien | H05K 7/208 |
| | | | | 62/238.3 |
| 11,392,095 | B2* | 7/2022 | Fread | G06F 9/453 |
| 2010/0154216 | A1* | 6/2010 | Hulen | E01C 11/26 |
| | | | | 29/890.033 |
| 2012/0279681 | A1* | 11/2012 | Vaughan | F25B 30/06 |
| | | | | 165/96 |

FOREIGN PATENT DOCUMENTS

| CN | 101586854 A | 11/2009 |
| CN | 107420959 A | 12/2017 |
| CN | 207797279 U | 8/2018 |

* cited by examiner

*Primary Examiner* — Joel M Attey
(74) *Attorney, Agent, or Firm* — ScienBiziP, P.C.

(57) ABSTRACT

A cooling and heating energy saving system includes a cooling and heating device, a data center, a boiler, a heat exchanger, and a circulating pump. The boiler receives waste heat of the data center and heat generated by the cooling and heating device, and then generates high-temperature heat and transfers the high-temperature heat to an indoor heating device. The heat exchanger receives heat from the cooling and heating device and the data center. The circulating pump receives the heat generated by the data center and transmits the heat to an outdoor cold source, and further transmits the outdoor cold source to an indoor device through the heat exchanger.

8 Claims, 1 Drawing Sheet

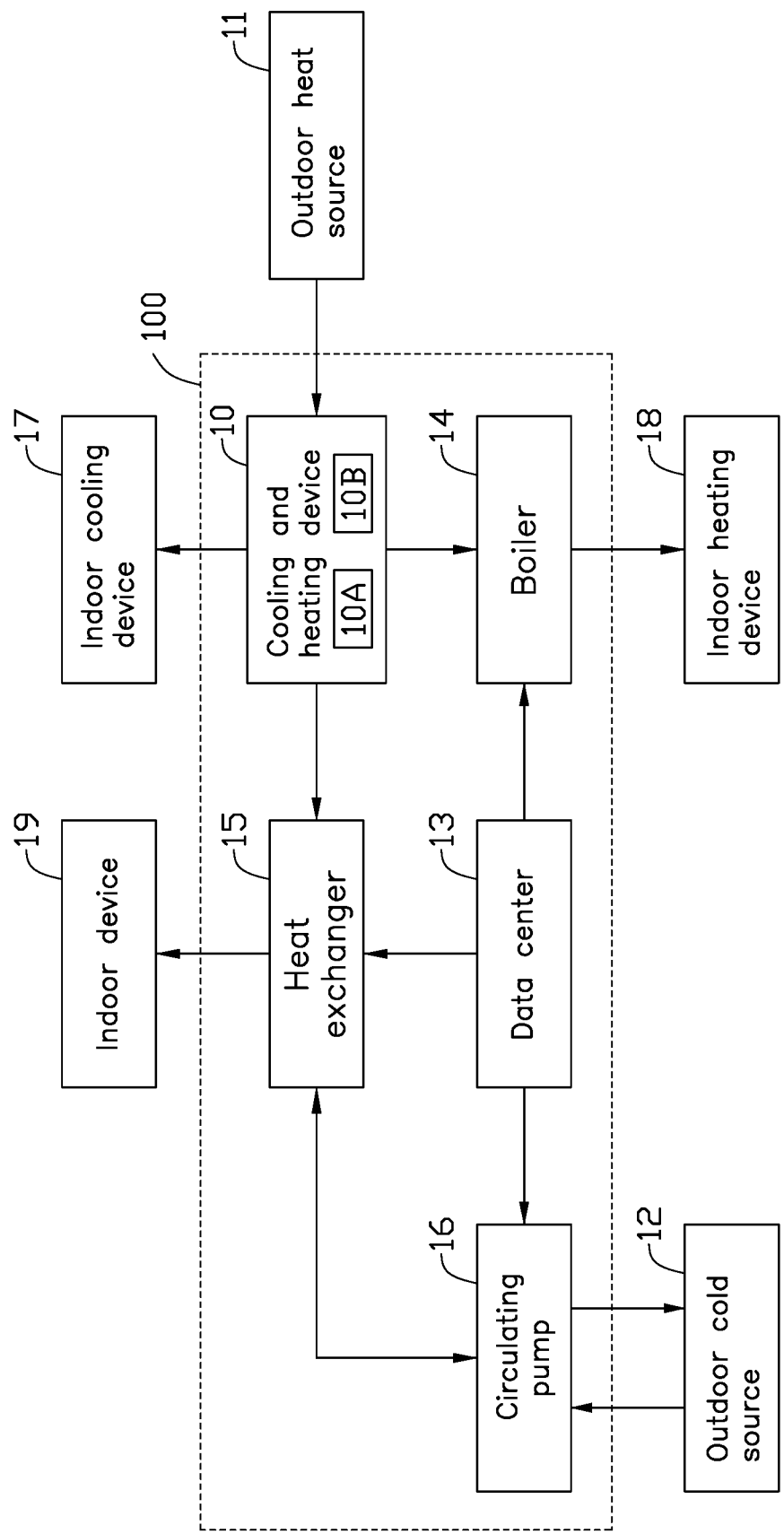

COOLING AND HEATING ENERGY SAVING SYSTEM AND ENERGY SAVING METHOD

FIELD

The subject matter herein generally relates to cooling and heating systems, and more particularly to a cooling and heating energy saving system and an energy saving method using the cooling and heating energy saving system.

BACKGROUND

With the rapid development of communication technology, Internet data centers have developed on a large scale. According to statistics, air conditioning in the computer room accounts for more than 50% of total power consumption in the computer room. Even if the outdoor temperature is low in winter, the computer room still needs to be cooled. The natural cold air outside the computer room is a huge natural cold source, which if used reasonably can save energy for cooling the computer room. Furthermore, the low-temperature waste heat generated by the data center has serious impacts and harms on the atmosphere, water bodies, soil, animals, and plants. Reusing the waste heat of the data center not only reduces the harm to the environment, but also reduces the consumption of other energy sources and improves energy efficiency.

BRIEF DESCRIPTION OF THE DRAWINGS

Implementations of the present disclosure will now be described, by way of embodiments, with reference to the attached FIGURES.

FIG. 1 is a diagrammatic block diagram of an embodiment of a cooling and heating energy saving system.

DETAILED DESCRIPTION

It will be appreciated that for simplicity and clarity of illustration, where appropriate, reference numerals have been repeated among the different FIGURES to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 shows an embodiment of a cooling and heating energy saving system 100, which includes a cooling and heating device 10, a data center 13, a boiler 14, a heat exchanger 15, and a circulating pump 16.

In one embodiment, the cooling and heating device 10 is coupled to an outdoor heat source 11, and the circulating pump 16 is coupled to an outdoor cold source 12. The cooling and heating device 10 performs indoor cooling or heating and is coupled to the outdoor heat source 11 to obtain outdoor heat to supplement heating performed by the cooling and heating energy saving system 100. In one embodiment, when the ambient temperature of the cooling and heating device 10 is lower than a first preset temperature, the cooling and heating device 10 performs heating, and when the ambient temperature of the cooling and heating device 10 is higher than a second preset temperature, the cooling and heating device 10 performs cooling. The first preset temperature may be 10 degrees Celsius, and the second preset temperature may be 25 degrees Celsius. In other embodiments, the first preset temperature may be above or below 10 degrees Celsius, and the second preset temperature may be above or below 25 degrees Celsius, as long as the first preset temperature is lower than the second preset temperature. The outdoor heat source 11 supplements the heat provided by the cooling and heating energy saving system 100. The data center 13 generates heat when the data center 13 is started to work. The boiler 14 is coupled to the cooling and heating device 10 and the data center 13. The boiler 14 receives waste heat generated by the data center 13 and heat from the cooling and heating device 10 to generate high-temperature heat, and then transfers the high-temperature heat to an indoor heating device 18.

The heat exchanger 15 is coupled to the cooling and heating device 10 and the data center 13. The heat exchanger 15 receives heat generated from the cooling and heating device 10 and the data center 13. The circulating pump 16 is coupled to the data center 13, the outdoor cold source 12, and the heat exchanger 15. The circulating pump 16 receives the heat generated by the data center 13 and transfers the heat to the outdoor cold source 12 to dissipate the heat. The circulating pump 16 also obtains a cold source from the outdoor cold source 12 and transmits the cold source to the heat exchanger 15, and then the heat exchanger 15 transmits the cold source to an indoor device 19.

In one embodiment, the cooling and heating device 10 includes a heating component 10A and a cooling component 10B. The heat generated by the heating component 10A performs indoor heating, and the heating component 10A is coupled to the boiler 14 and the heat exchanger 15 so that the boiler 14 and the heat exchanger 15 also receive the heat generated by the heating component 10A. The cooling component 10B is coupled to an indoor cooling device 17, and the indoor cooling device 17 receives cold generated by the cooling component 10B for indoor cooling.

In one embodiment, the heat exchanger 15 is also used to transfer heat from the heating component 10A and the data center 13 to the indoor device 19.

In one embodiment, the indoor cooling device 17 is a blower or an air-conditioner, but not limited thereto.

In one embodiment, the heating component 10A is a heat pump, and the cooling component 10B is a chiller, such as a water-cooled chiller.

The boiler 14 is coupled to the indoor heating device 18, the data center 13, and the cooling and heating device 10. The boiler 14 is used to receive the heat transferred from the heating component 10A of the cooling and heating device 10 and recover the waste heat generated by the data center 13, and then produce high-temperature heat and transmit the high-temperature heat to the indoor heating device 18. The indoor heating device 18 heats an indoor room after being heated.

In one embodiment, the indoor heating device 18 can be a reheater or a floor, but is not limited thereto. The reheater may be an air conditioning reheater or a blower reheater. The reheater is used to receive the heat of the boiler 14 and transfer the heat to a cold air outlet of the reheater so as to avoid the problem of condensation to maintain a comfortable indoor temperature environment.

In addition to consuming energy sources such as electric power, gas energy, or kerosene for heating, the boiler 14 receives heat from the heating component 10A of the cooling and heating device 10 and recovers the waste heat of the data center 13, so as to reduce the energy required in the heating process of the boiler 14, which is more environmentally friendly.

The heat exchanger 15 is coupled to the data center 13, the circulating pump 16, and the indoor device 19. The circulating pump 16 is coupled to the outdoor cold source 12. The waste heat generated during the operation of the data center 13 is not only recycled through the boiler 14 and the heat exchanger 15, but also causes the temperature of the data center 13 to increase. The excess waste heat of the data center 13 is transferred to the outdoor cold source 12 through the circulating pump 16, and the outdoor cold source 12 is used for auxiliary heat dissipation.

In one embodiment, the circulating pump 16 is also used to transfer the outdoor cold source 12 to the heat exchanger 15, and the heat exchanger 15 transmits the outdoor cold source 12 to the indoor device 19. The outdoor cold source 12 is used to perform indoor cooling to reduce the power consumption of the cooling and heating device 10 during the cooling process, thereby achieving an energy saving effect.

In one embodiment, the indoor device 19 is a chilling beam or blower, but is not limited thereto.

In one embodiment, the boiler 14 is a heat recovery hot water boiler.

In one embodiment, the heat exchanger 15 is a plate heat exchanger.

In one embodiment, the outdoor heat source 11 may be an underground heat source.

In one embodiment, the outdoor cold source 12 may be an outdoor pond.

An embodiment of the present disclosure also provides an energy saving method using the cooling and heating energy saving system 100, including:

Outputting the waste heat generated during the working process of the data center 13 to the boiler 14 and the heat exchanger 15 for recycling;

Collecting the outdoor cold source 12 through the circulating pump 16 and transmitting the outdoor cold source 12 to the heat exchanger 15;

Transmitting the outdoor cold source 12 through the heat exchanger 15 to the indoor device 19 for cooling; and Transmitting the waste heat generated by the data center 13 to the outdoor cold source 12 through the circulating pump 16, and dissipating the waste heat by the outdoor cold source 12.

The cooling and heating energy saving system 100 uses the cooling and heating device 10 and the boiler 14 to perform indoor cooling and heating requirements. At the same time, the waste heat generated during the operation of the data center 13 is recycled and reused. The outdoor heat source 11 is used to supplement the indoor heat and the outdoor cold source 12 is used for heat dissipation and cooling. The cooling and heating energy saving system 100 collects the waste heat of the data center 13 for recycling, and uses the outdoor cold source 12 for auxiliary heat dissipation, thereby reducing the energy consumption for cooling and heating in order to maintain a comfortable environment. The system is energy saving and environmentally friendly.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A cooling and heating energy saving system comprising:
    a cooling and heating device for performing indoor cooling and heating;
    a data center generating heat when turned on to operate;
    a boiler coupled to the cooling and heating device and the data center, the boiler being configured to receive heat energy including waste heat of the data center and heat generated by the cooling and heating device, and transfer the heat energy to a reheater or a floor;
    a heat exchanger coupled to the cooling and heating device and the data center, the heat exchanger being configured to receive heat from the cooling and heating device and the data center; and
    a circulating pump coupled to the data center, an outdoor cold source, and the heat exchanger, the circulating pump being configured to receive the heat generated by the data center and transmit the heat to the outdoor cold source for heat dissipation, the circulating pump being further configured to transmit the outdoor cold source to an indoor device through the heat exchanger.

2. The cooling and heating energy saving system of claim 1, wherein:
    the cooling and heating device comprises a heating component and a cooling component;
    the boiler and the heat exchanger receive heat generated by the heating component; and
    the cooling component is configured to transmit a cold source to an indoor cooling device.

3. The cooling and heating energy saving system of claim 1, wherein:
    the heat exchanger is further configured to transmit the heat from the heating and cooling device and the data center to the indoor device.

4. The cooling and heating energy saving system of claim 2, wherein:
    the heat exchanger is further configured to transmit the heat from the heating and cooling device and the data center to the indoor device.

5. The cooling and heating energy saving system of claim 3, wherein:
    the indoor device is a chilling beam or blower.

6. The cooling and heating energy saving system of claim 2, wherein:
    the heating component is a heat pump.

7. The cooling and heating energy saving system of claim 6, wherein:
    the cooling component is a chiller.

8. The cooling and heating energy saving system of claim 7, wherein:
the chiller is a water-cooled chiller.

\* \* \* \* \*